United States Patent
Utsumi et al.

(10) Patent No.: US 7,041,389 B2
(45) Date of Patent: May 9, 2006

(54) COLOR-CONVERTING/FILTER SUBSTRATE, MULTI-COLOR ORGANIC EL DISPLAY PANEL USING THE COLOR-CONVERTING/FILTER SUBSTRATE, AND MANUFACTURING METHODS THEREOF

(75) Inventors: Makoto Utsumi, Kanagawa (JP); Koji Kawaguchi, Kanagawa (JP)

(73) Assignee: Fuji Electric Co., Ltd., (JP)

( * ) Notice: Subject to any disclaimer, the term of this patent is extended or adjusted under 35 U.S.C. 154(b) by 180 days.

(21) Appl. No.: 10/624,426

(22) Filed: Jul. 22, 2003

(65) Prior Publication Data

US 2004/0137258 A1 Jul. 15, 2004

(51) Int. Cl.
*C23C 14/00* (2006.01)
*H05B 33/12* (2006.01)

(52) U.S. Cl. .................. 428/690; 428/917; 427/66; 313/504; 313/506; 313/512

(58) Field of Classification Search ................ 428/629, 428/690, 917; 427/66; 204/192.12; 313/504, 313/506, 512
See application file for complete search history.

(56) References Cited

U.S. PATENT DOCUMENTS 6,198,220 B1    3/2001   Jones et al.
6,506,506 B1 *   1/2003   Tomiuchi et al. ........... 428/690

FOREIGN PATENT DOCUMENTS

| GB | 2 330 454 A | 10/1998 |
|---|---|---|
| JP | 10-275680 (A) | 10/1998 |
| JP | 2000-214318 | 8/2000 |
| JP | 2001-052866 A * | 2/2001 |
| JP | 2001-52870 (A) | 2/2001 |
| JP | 2001-52873 (A) | 2/2001 |
| WO | WO 00/26973 A | 5/2000 |
| WO | WO 00/60904 A | 10/2000 |

OTHER PUBLICATIONS

Relevant portion of GB Search Report mailed Jan. 5, 2004.

* cited by examiner

*Primary Examiner*—Dawn Garrett
(74) *Attorney, Agent, or Firm*—Rossi, Kimms & McDowell, LLP

(57) ABSTRACT

A color conversion type multi-color organic EL display panel is provided in which the lifetime of an organic EL light emitter is improved by preventing migration of moisture to the organic EL light emitter and dispersing heat generated during driving well. The display utilizes a color-converting/filter substrate that includes a transparent supporting substrate, color-converting/filter layers of a single type or a plurality of types arranged on the supporting substrate, a polymeric film layer that covers the color-converting/filter layers and is formed transparent and flat, and a transparent inorganic film layer that is formed on the polymeric film layer. The inorganic film layer is a laminate of one or a plurality of metallic film(s) or metal oxide film(s), and one or a plurality of insulating film(s) each containing at least one of Si and Al and at least one of O and N.

14 Claims, 4 Drawing Sheets

| LAYER | MATERIAL | STRUCTURAL FORMULA |
|---|---|---|
| HOLE INJECTION LAYER | Copper phthalocyanine |  |
| HOLE TRANSPORT LAYER | 4,4'-bis(N-(1-maphthyl)-N-phenylamino) biphenyl |  |
| LIGHT EMITTING LAYER | 4,4'-bis (2,2'-diphenylvinyl) biphenyl |  |
| ELECTRON INJECTION LAYER | Tris(8-hydroxyquinoline) aluminum complex |  |

| SAMPLE | NON-LIGHT-EMITTING AREA | | BRIGHTNESS | |
|---|---|---|---|---|
| | PERCENTAGE INCREASE (%) | RATIO | PERCENTAGE RETENTION (%) | RATIO |
| EXAMPLE 1 | 6 | 0.75 | 89 | 1.11 |
| EXAMPLE 2 | 4 | 0.50 | 91 | 1.14 |
| EXAMPLE 3 | 5 | 0.63 | 87 | 1.09 |
| COMPARATIVE EXAMPLE 1 | 8 | 1 | 80 | 1 |
| COMPARATIVE EXAMPLE 2 | 96 | 12 | 2 | 0.03 |

FIG. 5

COLOR-CONVERTING/FILTER SUBSTRATE, MULTI-COLOR ORGANIC EL DISPLAY PANEL USING THE COLOR-CONVERTING/FILTER SUBSTRATE, AND MANUFACTURING METHODS THEREOF

BACKGROUND OF THE INVENTION

The present invention relates to a color-converting/filter substrate that enables multi-color display with high detail and is excellent in terms of environmental resistance and productivity, and a multi-color organic luminescent display device having the color-converting/filter substrate. More specifically, the present invention relates to a color-converting/filter substrate for display use in image sensors, personal computers, word processors, televisions, facsimiles, audio equipment, video equipment, car navigation equipment, desk-top electronic calculators, telephones, mobile terminal equipment, industrial measuring equipment, and so on, and a multi-color organic luminescent display device having the color-converting/filter substrate. In particular, the present invention relates to a multi-color organic EL display panel that uses a color conversion method.

In recent years, there have been rapid advances in the diversification of information. Amid this, 'attractiveness, lightness, thinness, and excellent performance' have come to be demanded of display devices in the information field, and development has been carried out vigorously with an aim of further reducing power consumption and making devices that respond faster. In particular, ideas on high-detail full-color display devices have been widely put forward.

A laminate type organic electroluminescence (hereinafter referred to as 'organic EL') device that has an organic molecule thin-film layered structure, emits light with a high brightness of 1000 cd/m$^2$ or more at an applied voltage of 10V, and is superior to liquid crystal display devices and so on in terms of viewing angle dependence, fast response and so on, was reported by Tang et al. in 1987 (Appl. Phys. Lett., 51, 913), and ever since research with an aim of making organic EL devices fit for practical use has been vigorously carried pursued. Moreover, the development of similar devices using organic polymeric materials has also been vigorously pursued carried out.

With organic EL devices, a high current density can be realized at a low voltage, and hence emitted light brightness and light emission efficiency can be expected to be higher than with inorganic EL devices or LEDs. Moreover, organic EL devices have excellent characteristics as display devices, for example (1) high brightness and high contrast, (2) low-voltage driving and high light emission efficiency, (3) high resolution, (4) wide angle of visibility, (5) high response speed, (6) realization of high-detail, multi-color display, and (7) lightness and thinness. Due to these points, application to flat panel displays that have 'attractiveness, lightness, thinness, and excellent performance' can be anticipated.

Green monochrome organic EL display panels for installation in automobiles and the like were commercialized by the company Pioneer in November 1997. There is now a rush to make fit for practical use multi-color organic EL display panels that have long-term stability and fast response, and are capable of high-detail multi-color or full-color display, this being to answer to the diversifying needs of society in the future.

One example of a method of making organic EL display panels be multi-color or full-color is a method in which light emitters of the three primary colors red (R), green (G) and blue (B) are arranged separated from one another in a matrix, and are each made to emit light (see Japanese Patent Application Laid-open No. 57-157487, Japanese Patent Application Laid-open No. 58-147989, Japanese Patent Application Laid-open No. 3-214593, etc.). With this method, light-emitting materials of the three types red, green and blue must be arranged with high precision in a matrix, and hence this is technically difficult, and moreover manufacture cannot be carried out cheaply. In addition, there are drawbacks such as the color shifting upon prolonged usage due to the lifetime (the brightness change characteristic) differing between the three types of light-emitting material.

Moreover, a method in which colored filters are used with a backlight that emits white light, thus transmitting the three primary colors is also known (see Japanese Patent Application Laid-open No. 1-315988, Japanese Patent Application Laid-open No. 2-273496, Japanese Patent Application Laid-open No. 3-194885, etc.). However, an organic EL light emitter that emits white light of a sufficiently high brightness and has a sufficiently long lifetime for obtaining red, green and blue light of high brightness has not yet been obtained.

Moreover, a method in which fluorescent bodies that are arranged separated from one another in a plane are made to absorb light emitted from a light emitter, and hence fluorescence of a plurality of colors is emitted from the fluorescent bodies is also known (see Japanese Patent Application Laid-open No. 3-152897, etc.). Such a method has been used with CRTs, plasma displays, and so on.

Moreover, in recent years, a color conversion method in which fluorescent materials that absorb light in the emission region of an organic EL light emitter and then emit fluorescence in the visible region are used in filters has been disclosed (See, Japanese Patent Application Laid-open No. 5-258860, etc.). The color of the light emitted by the organic EL light emitter is not limited to being white, and hence an organic EL light emitter having a higher brightness can be used as the light source; in the case of a color conversion method in which an organic EL light emitter that emits blue light is used (Japanese Patent Application Laid-open No. 3-152897, Japanese Patent Application Laid-open No. 8-286033, Japanese Patent Application Laid-open No. 9-208944, etc.), the blue light is subjected to wavelength conversion into green light and red light. If color-converting/filters containing such fluorescent colorants are patterned with high detail, then a luminescent-type display that is full-color despite using low-energy radiation such as near ultraviolet light or visible light from a light emitter can be constructed.

Examples of the method of patterning the color-converting/filters include (1) a method in which, as in the case of an inorganic fluorescent body, a fluorescent colorant is dispersed in a liquid resist (photoreactive polymer), a film thereof is formed using a spin coating method or the like, and then patterning is carried out using a photolithography method (Japanese Patent Application Laid-open No. 5-198921, Japanese Patent Application Laid-open No. 5-258860), and (2) a method in which a fluorescent colorant or fluorescent pigment is dispersed in a basic binder, and then this is etched using an acidic aqueous solution (Japanese Patent Application Laid-open No. 9-208944).

Important issues with regard to the practical use of an organic EL light emitter in a multi-color display panel are having a high-detail multi-color display capability, and having long-term stability with regard to color reproducibility and so on (see Kino Zairyo ('Functional Materials'), Vol. 18, No. 2, page 96). However, with multi-color organic EL display panels, there is a drawback that after driving for a certain time, there is a marked deterioration in the current-brightness characteristic.

A typical cause of this deterioration in light emission characteristics is the growth of dark spots. Dark spots are points where there is a defect in light emission. As oxidation progresses during driving or storage, the growth of dark spots progresses, and the dark spots spread over the whole of the light-emitting surface. It is thought that such dark spots are caused by oxidation or agglomeration of the layered materials constituting the light emitter due to oxygen or moisture in the light emitter. The growth of dark spots progresses not only during passing of a current, but also during storage, and is thought, in particular, to be (1) accelerated by oxygen or moisture present around the light emitter, (2) affected by oxygen or moisture present as an adsorbate in the organic layered films, and (3) affected also by moisture adsorbed on components when producing the light emitter or by the infiltration of moisture during manufacture or the like.

The typical sectional structure of a color conversion type multi-color organic EL display panel is shown in FIG. 1. Color-converting/filter layers 22 to 24 of three types are formed on a supporting substrate 21, and a polymeric film layer 25 covers the color-converting/filter layers 22 to 24, with an upper surface of the polymeric film layer 25 being made to be flat. Furthermore, transparent electrodes (anodes) 26, a hole injection layer 27, a hole transport layer 28, a light-emitting layer 29, a hole injection layer 30, and cathodes 31 are formed on the polymeric film layer 25. Here, as shown in FIG. 1, the color-converting/filter layers 22, 23 and 24 are provided below the transparent electrodes 26. As mentioned above, the color-converting/filter layers each comprise a resin having color-converting colorant (s) mixed therein. Moreover, due to the problem of the thermal stability of the colorant (s) mixed in, drying cannot be carried out at a temperature above 200° C., and hence there is a high possibility of the color-converting/filter layers being formed in a state in which moisture contained in the application liquid or moisture that has got in during the pattern formation step is still held. Such moisture held in the color-converting/filter layers passes through the polymeric film layer and reaches the light emitter during storage or driving, and is a factor in the growth of dark spots being promoted.

As a method of preventing such moisture from infiltrating in to the organic EL light emitter, art is known in which an insulating inorganic oxide film layer is provided to a thickness of 0.01 to 200 µm between the color-converting/filter layers and the organic EL light emitter (i.e. between the polymeric film layer 25 and the transparent electrodes 26 or the hole injection layer 27 in FIG. 1) (Japanese Patent Application Laid-open No. 8-279394). The inorganic oxide film layer is required to have high moisture resistance for maintaining the life of the organic light-emitting layer. Specifically, it is considered to be preferable for the gas permeability coefficients for water vapor and oxygen of the inorganic oxide film layer to both be not more than $10^{-13}$ cc·cm/cm$^2$·s·cmHg (according to the gas permeability test method of JIS K7126).

Moreover, as shown in Japanese Patent Application Laid-open No. 7-146480 or Japanese Patent Application Laid-open No. 10-10518, as a method of forming an inorganic film layer, there is a method in which $SiO_x$ or $SiN_x$ is formed by DC sputtering on the polymeric film layer that has been formed on the colored filter layers, and there is known to be an effect of improving the adhesion of the transparent electrodes. Moreover, there is also a method in which low-melting-point glass is sintered (Japanese Patent Application Laid-open No. 2000-214318).

Regarding the deterioration of the performance of the organic EL light emitter, research has been carried out vigorously in various places, and up to now a variety of causes have been announced. One of these is that organic EL layers such as a light-emitting layer are made from a material having low heat resistance, and hence deterioration of the performance due to heat generated during driving of the light emitter is a serious problem.

As described above, with a color conversion type multi-color organic EL display panel, in addition to having a function of preventing moisture held in the color-converting layers from passing through the polymeric film layer and reaching the light emitter during storage or driving, which is a factor in the growth of dark spots being promoted, it is also necessary to efficiently disperse to the surroundings heat generated through driving the light emitter, thus keeping the temperature of the color-converting layers and the light emitter low and hence preventing deterioration thereof.

Moreover, it is necessary to form the inorganic film layer with good adhesion to the polymeric film layer so as to be able to cope with large changes in the driving environment, i.e. the temperature and humidity.

In view of the problems described above, it is desirable to provide a multi-color organic EL display panel for which stable light emission characteristics are maintained over a prolonged period, and to realize a method for efficiently forming such a multi-color organic EL display panel.

SUMMARY OF THE INVENTION

A color-converting/filter substrate according to a first form of the present invention includes at least: a transparent supporting substrate; color-converting/filter layers of a single type or a plurality of types that are arranged on said supporting substrate and that each comprise a photopolymerizable resin film of thickness at least 5 µm containing at least one fluorescent colorant formed in a desired pattern; a polymeric film layer that covers the color-converting/filter layers and is formed so as to be transparent and flat; and a transparent inorganic film layer that is formed on the polymeric film layer; wherein the inorganic film layer is a laminate of one or a plurality of metallic film(s), and one or a plurality of insulating film(s) each containing at least one of Si and Al and at least one of O and N. The metallic film(s) preferably each comprise a metal selected from the group consisting of Ag, Al, Au, Cr, Cu, In, Mo, Ni, Pt, Rh, Ru, W, Zn, and alloys thereof.

A color-converting/filter substrate according to a second form of the present invention includes at least: a transparent supporting substrate; color-converting/filter layers of a single type or a plurality of types that are arranged on said supporting substrate and that each comprise a photopolymerizable resin film of thickness at least 5 µm containing at least one fluorescent colorant formed in a desired pattern; a polymeric film layer that covers the color-converting/filter layers and is formed so as to be transparent and flat; and a transparent inorganic film layer that is formed on the polymeric film layer; wherein the inorganic film layer is a laminate of one or a plurality of electrically conductive metal oxide film(s) each containing at least one of In, Sn and Zn, and one or a plurality of insulating film(s) each containing at least one of Si and Al and at least one of O and N.

A multi-color organic EL display panel according to a third form of the present invention has the color-converting/filter substrate according to the first or second form.

A method of manufacturing a color-converting/filter substrate according to a fourth form of the present invention includes: forming, on a transparent supporting substrate, color-converting/filter layers of a single type or a plurality of types that each comprise a photopolymerizable resin film of thickness at least 5 μm containing at least one fluorescent colorant and have a desired pattern; forming a flat, transparent polymeric film layer covering the color-converting/filter layers; forming, using a sputtering method, a metallic film, or a metal oxide film containing at least one of In, Sn and Zn; and forming an insulating film containing at least one of Si and Al and at least one of O and N.

A method of manufacturing a multi-color organic EL display panel according to a fifth form of the present invention includes: forming, on a transparent supporting substrate, color-converting/filter layers of a single type or a plurality of types that each comprise a photopolymerizable resin film of thickness at least 5 μm containing at least one fluorescent colorant and have a desired pattern; forming a flat, transparent polymeric film layer covering the color-converting/filter layers; forming, using a sputtering method, a metallic film, or a metal oxide film containing at least one of In, Sn and Zn; forming an insulating film containing at least one of Si and Al and at least one of O and N; forming a first electrode layer; forming an organic light-emitting layer; and forming a second electrode layer.

BRIEF DESCRIPTION OF THE DRAWINGS

The invention will be described in greater detail with reference to certain preferred embodiments thereof and the accompanying drawings, wherein:

FIG. 5 is a table illustrating a comparison between an initial non-light-emitting area and brightness.

DETAILED DESCRIPTION OF THE PREFERRED EMBODIMENTS

Figure 1:
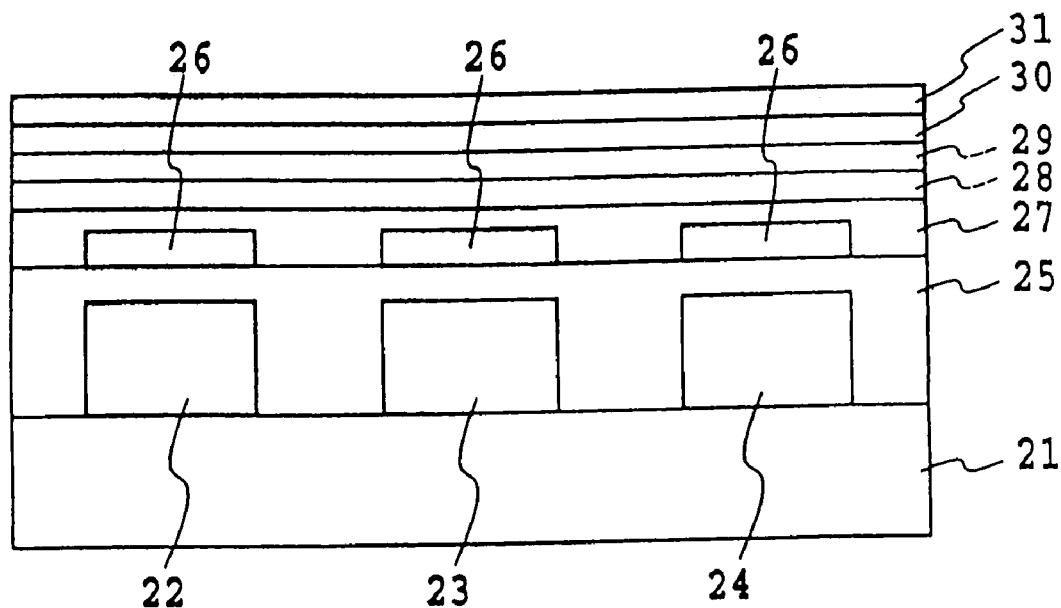
FIG. 1 is a schematic sectional view showing a multi-color organic EL display panel of prior art.
Figure 2:
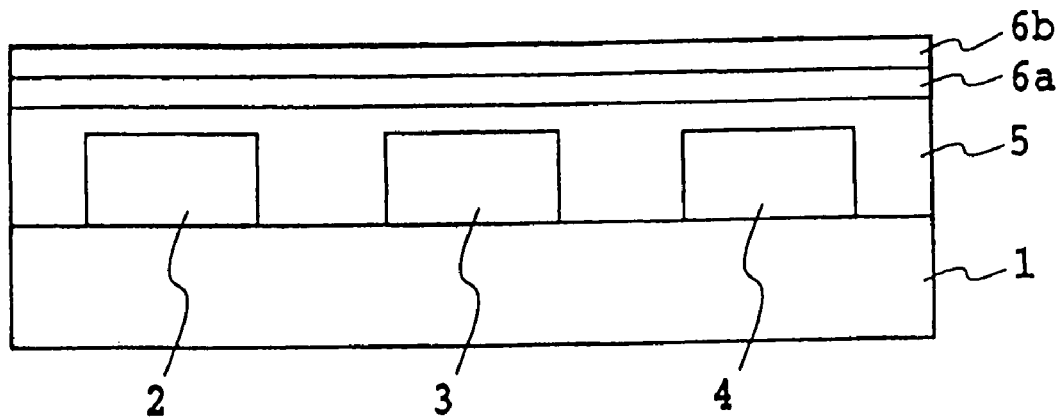
FIG. 2 is a schematic sectional view of a color-converting/filter substrate of the present invention.

An example of the color-converting/filter substrate of the present invention is shown in FIG. 2. In FIG. 2, red color-converting layers 2, green color-converting layers 3 and blue color-converting layers 4 are formed in a prescribed pattern on a supporting substrate 1, and a polymeric film layer 5 is formed covering these color-converting layers 2, 3 and 4. As will be described later, the green color-converting layers 3 may be green filter layers. Moreover, the blue color-converting layers 4 are preferably blue filter layers. Note that in the present specification, color-converting layers and filter layers are referred to collectively as 'color-converting/filter layers'. An inorganic film layer 6 is formed covering the polymeric film layer 5, with the upper surface of the inorganic film layer 6 being flat. In FIG. 2, an inorganic film layer having a two-layer structure comprising a first inorganic film layer 6a and a second inorganic film layer 6b is shown. In the present specification, the first inorganic film layer 6a and the second inorganic film layer 6b are sometimes referred to collectively as the 'gas barrier layer 6'. Note also that in the present specification and drawings, parts having the same function as one another are represented by the same reference numeral. Following is a detailed description of each of the layers.

In the present invention, the organic fluorescent colorant(s) absorb light in the near ultraviolet region or visible region, in particular light in the blue or blue/green region, emitted from a light emitter, and emit visible light of a different wavelength as fluorescence. Preferably at least one or more fluorescent colorant(s) that emit(s) fluorescence in the red region is/are used, and this/these may be combined with one or more fluorescent colorant (s) that emit(s) fluorescence in the green region. Specifically, in the case of using an organic EL light emitter that emits light in the blue or blue/green region as a light source, if one attempts to obtain light in the red region merely by passing the light from the light emitter through a red filter, then due to there originally being little light of wavelengths in the red region, the outputted light will be extremely dim.

By converting the light in the blue or blue/green region from the light emitter into light in the red region using fluorescent colorant(s), it thus becomes possible to output light in the red region of sufficient intensity. Moreover, regarding light in the green region, similarly to the light in the red region, the light from the light emitter may be converted into light in the green region using other organic fluorescent colorant(s) and then outputted. Alternatively, if the light from the light emitter contains sufficient light in the green region, then the light from the light emitter may be merely passed through a green filter and then outputted. Furthermore, regarding light in the blue region, the light from the organic EL light emitter can be merely passed through a blue filter and then outputted.

Examples of fluorescent colorants that absorb light from the blue to blue/green region emitted from a light emitter and emit fluorescence in the red region are rhodamine type colorants such as Rhodamine B, Rhodamine 6G, Rhodamine 3B, Rhodamine 101, Rhodamine 110, sulforhodamines, Basic Violet 11 and Basic Red 2, cyanine type colorants, pyridine type colorants such as 1-ethyl-2-[4-(p-dimethylaminophenyl)-1,3-butadienyl]pyridinium perchlorate (Pyridine 1), oxazine type colorants, and so on. Furthermore, various dyes (direct dyes, acid dyes, basic dyes, disperse dyes, etc.) can also be used if fluorescent.

Examples of fluorescent colorants that absorb light from the blue to blue/green region emitted from a light emitter and emit fluorescence in the green region are coumarin type colorants such as 3-(2'-benzothiazolyl)-7-diethylaminocoumarin (Coumarin 6), 3-(2'-benzoimidazolyl)-7-diethylaminocoumarin (Coumarin 7), 3-(2'-N-methylbenzoimidazolyl)-7-diethylaminocoumarin (Coumarin 30) and 2,3,5,6-1H,4H-tetrahydro-8-trifluoromethylquinolizino-(9,9a,1-gh)coumarin (Coumarin 153), and Basic Yellow 51, which is a coumarin colorant type dye, and also naphthalimide type colorants such as Solvent Yellow 11 and Solvent Yellow 116, and so on. Furthermore, various dyes (direct dyes, acid dyes, basic dyes, disperse dyes, etc.) can also be used if fluorescent.

Note that organic fluorescent colorant(s) used in the present invention may be kneaded in advance with a polymethacrylic acid ester, polyvinyl chloride, a vinyl chloride-vinyl acetate copolymer resin, an alkyd resin, an aromatic sulfonamide resin, a urea resin, a melamine resin, a benzoguanamine resin, a mixture of such resins, or the like, to form an organic fluorescent pigment. Moreover, the above organic fluorescent colorants and organic fluorescent pigments (in the present specification, the two are grouped together and referred to generically as 'organic fluorescent colorants') may be used singly, or two or more may be used in combination to adjust the color tone of the fluorescence.

The organic fluorescent colorant(s) used in the present invention is/are contained in the color-converting layers in an amount of 0.01 to 5 mass %, more preferably 0.1 to 2 mass %, relative to the weight of the color-converting layer. If the organic fluorescent colorant content is less than 0.01 mass %, then it will not be possible to carry out sufficient wavelength conversion, whereas if this content exceeds 5 mass %, then a drop in the color conversion efficiency will be brought about due to effects such as concentration quenching.

Next, the matrix resin used in the color-converting layers in the present invention is one obtained by subjecting a light-curable or joint-light/heat-curable resin (resist) to light and/or heat treatment, thus generating radical species or ionic species and hence polymerizing or crosslinking the resin, thus making the resin insoluble and unmeltable. Moreover, to pattern the color-converting layers, it is preferable for the light-curable or joint-light/heat-curable resin to be soluble in an organic solvent or an alkaline solution in the state in which the resin has not been exposed to light.

Specifically, such matrix resins include (1) ones obtained by subjecting a film of a composition comprising an acrylic polyfunctional monomer or oligomer having a plurality of acryloyl groups or methacryloyl groups and a photopolymerization or thermopolymerization initiator to light or heat treatment, thus generating photo-radicals or thermal radicals and hence carrying out polymerization, (2) ones obtained by subjecting a composition comprising a polyvinyl cinnamic acid ester and a sensitizer to light or heat treatment, thus carrying out dimerization and crosslinking, (3) ones obtained by subjecting a film of a composition comprising a chain or cyclic olefin and a bisazide to light or heat treatment, thus generating a nitrene and crosslinking the olefin, (4) ones obtained by subjecting a film of a composition comprising a monomer having epoxy groups and an acid generator to light or heat treatment, thus generating an acid (cations) and carrying out polymerization, and so on. In particular, (1) ones obtained by subjecting a composition comprising an acrylic polyfunctional monomer or oligomer and a photopolymerization or thermopolymerization initiator to polymerization are preferable. This is because, with such a composition, high-detail patterning is possible, and the reliability in terms of solvent resistance, thermal resistance and so on is high after polymerization.

Regarding photopolymerization initiators, sensitizers and acid generators that can be used in the present invention, ones that initiate polymerization through light of a wavelength that is not absorbed by the fluorescent colorant(s) contained in the resin are preferable. In the color-converting layers in the present invention, in the case that the light-curable or joint-light/heat-curable resin can be polymerized by light or heat as is, it is possible to not add a photopolymerization or thermopolymerization initiator.

The matrix resin is (color-converting layers are) formed by applying a solution or dispersion containing the light-curable or joint-light/heat-curable resin, the organic fluorescent colorant(s) and additives onto the supporting substrate to form a resin layer, and then polymerizing the light-curable or joint-light/heat-curable resin by exposing with light at desired parts. After the light-curable or joint-light/heat-curable resin has been made insoluble by exposing with light at the desired parts, patterning is carried out. The patterning can be carried out through a commonly-used method, for example removing the resin at the parts that have not been exposed with light using an organic solvent or alkaline solution that dissolves or disperses the resin at the parts that have not been exposed with light.

The polymeric film layer 5 is preferably made of a material that has high transparency in the visible region (a transmittance of at least 50% in a range of 400 to 700 nm), Tg of at least 100° C., and a surface hardness of at least pencil hardness 2H, for which a smooth coating film can be formed on the color-converting layers 2 to 4, and that does not cause deterioration in the functions of the color-converting layers 2 to 4. Examples of such materials are light-curable resins and/or heat-curable resins such as imide-modified silicone resins (see Japanese Patent Application Laid-open No. 5-134112, Japanese Patent Application Laid-open No. 7-218717, Japanese Patent Application Laid-open No. 7-306311, etc.), materials obtained by dispersing an inorganic metal compound ($TiO_2$, $Al_2O_3$, $SiO_2$, etc.) in an acrylic, polyimide or silicone resin or the like (see Japanese Patent Application Laid-open No. 5-119306, Japanese Patent Application Laid-open No. 7-104114, etc.), acrylate monomer/oligomer/polymer resins having reactive vinyl groups, resist resins (see Japanese Patent Application Laid-open No. 6-300910, Japanese Patent Application Laid-open No. 7-128519, Japanese Patent Application Laid-open No. 8-279394, Japanese Patent Application Laid-open No. 9-330793, etc.), and fluororesins (Japanese Patent Application Laid-open No. 5-36475, Japanese Patent Application Laid-open No. 9-330793). Alternatively, an inorganic compound formed through a sol-gel method (see Gekkan Display, 1997, Vol. 3, No. 7, Japanese Patent Application Laid-open No. 8-27934, etc.) may be used. Furthermore, in the case of using an epoxy resin having a mesogenic structure that has a high thermal conductivity, heat can be dissipated toward the substrate.

There are no particular limitations on the method of forming the polymeric film layer 5. For example, the polymeric film layer 5 can be formed using a commonly-used method such as a dry method (sputtering, vapor deposition, CVD, etc.) or a wet method (spin coating, roll coating, casting, etc.).

The inorganic film layer in the present invention is a laminate of metallic film(s) and insulating film(s), or a laminate of conductive metal oxide film(s) and insulating film(s) The inorganic film layer in the present invention may be a laminate of one or a plurality of metallic film(s) and one or a plurality of insulating film(s), or a laminate of one or a plurality of conductive metal oxide film(s) and one or a plurality of insulating film(s). FIG. 2 shows a constitution in which one metallic film or conductive metal oxide film and one insulating film are used. Here, it is preferable for the first inorganic film layer 6a to be the metallic film or metal oxide film, and for the second inorganic film layer 6b to be the insulating film.

As the material of a metallic film, a metal selected from Ag, Al, Au, Cr, Cu, In, Mo, Ni, Pt, Rh, Ru, W and Zn, or an alloy thereof, can be used. Such a metallic film has high thermal conductivity, and is thus effective in efficiently dispersing heat generated by the organic EL light emitter to the surroundings. Moreover, by forming such a metallic film, the ability to capture moisture and oxygen is improved, and hence it becomes possible to prevent migration of moisture and oxygen from the color-converting layers to the organic EL light emitter. It is preferable to use a material having a thermal conductivity, which is a factor indicative of the heat dissipating ability, of at least 50 W/m·K for the metallic film. In addition to the metals listed above, Be, Ca, Co, K, Mg and so on can also be used. Note, however, that if the metallic film is too thick then the optical transparency will drop, and hence it is preferable to use a thin film of thickness not more than approximately 30 nm.

As the material of a metal oxide film, a metal oxide containing at least one of In, Sn and Zn can be used. The metal oxide may be electrically conductive. For example, ITO (an In—Sn oxide), NESA, an In oxide, IZO (an In—Zn oxide), a Zn oxide, a Zn—Al oxide, a Zn—Ga oxide, or one of these to which a dopant such as F or Sb has been added can be used. Such a metal oxide film is also effective in efficiently dispersing heat generated by the organic EL light emitter to the surroundings. Moreover, by forming such a metal oxide film, the ability to capture moisture and oxygen is improved, and hence it becomes possible to prevent migration of moisture and oxygen from the color-converting layers to the organic EL light emitter. A metal oxide film made of such a material has high transparency, and hence can be made thicker than a metallic film; the metal oxide film preferably has a thickness of 50 to 300 nm. By forming a metal oxide film having a thickness in this range, the number of pinholes can be reduced, and hence a good gas (moisture and oxygen) barrier ability can be provided.

As an insulating film, it is preferable to use a material that is electrically insulating, acts as a barrier against gases and organic solvents, has high transparency in the visible region (a transmittance of at least 50% in a range of 400 to 700 nm), and has a hardness sufficient to withstand the deposition of the organic EL light emitter-constituting layers onto the insulating film (preferably a pencil hardness of at least 2H). Preferable materials for the insulating film are materials containing at least one of Si and Al and at least one of O and N. For example, $SiO_x$, $SiN_x$, $SiO_xN_y$, $AlO_x$, $AlN_x$, or Si—Al—O—N can be used. By providing an insulating film containing such a material, the adhesion of transparent electrodes 7 formed thereon can be improved. Furthermore, such a material has a higher thermal conductivity than polymeric materials, and is thus able to assist the dispersion of heat to the surroundings by the metallic film(s) or metal oxide film(s). Moreover, by forming such conductive metal oxide film(s), the ability to capture moisture and oxygen is improved, and hence it becomes possible to prevent migration of moisture and oxygen from the color-converting layers to the organic EL light emitter. The insulating film may have a thickness of 50 to 2000 nm. The insulating film can be formed easily using a reactive sputtering method or a CVD method. Moreover, in addition to the materials listed above, an inorganic material such as $TiO_x$, $TaO_x$, SiC or diamond-like carbon can be used.

As methods of forming the insulating film(s), and the metallic film(s) or the metal oxide film(s), a vacuum deposition method, a sputtering method, or a CVD method can be used. In particular, when forming the metallic film(s) or the metal oxide film(s), from the viewpoints of adhesion, uniformity of the film thickness, and productivity, it is preferable to use a sputtering method (including reactive sputtering).

It is preferable for the uppermost layer of the inorganic film layer laminate, i.e. the layer on which the electrodes will be formed, to be an insulating film. The reason for this is that such an insulating film has a hardness sufficient to withstand the deposition of the organic EL light emitter-constituting layers. In particular, in the case of using an organic EL light emitter that has mutually intersecting stripe-shaped anodes and cathodes and is subjected to matrix driving, if an electrically conductive metallic film or metal oxide film contacts the electrodes, then driving of the light emitter will be impossible, and hence it is preferable for the uppermost layer to be an insulating film. On the other hand, in the case that the organic EL light emitter has an active matrix structure and a single transparent electrode is formed uniformly over the whole of the inorganic film layer as will be described later, the uppermost layer may be an electrically conductive metallic film or metal oxide film. This is because, in this case, the metallic film or metal oxide film can be used as a supplementary electrode layer.

In the case of constituting the inorganic film layer from a plurality of metallic films or metal oxide films and a plurality of insulating films, the order of forming these films may be freely chosen. That is, the metallic films or metal oxide films and the insulating films maybe formed alternately, or the plurality of metallic films or metal oxide films may be formed first, followed by the plurality of insulating films.

The supporting substrate 1 used in the color-converting/filter substrate of the present invention must be transparent to the light that has been converted by the color-converting layers 2 to 4 described earlier. Moreover, the supporting substrate 1 should be able to withstand the conditions (solvents, temperatures, etc.) used in the formation of the color-converting layers 2 to 4 and the gas barrier layer 6, and furthermore preferably has excellent dimensional stability.

Materials that are preferable as the material of the supporting substrate 1 include glasses, and resins such as polyethylene terephthalate and polymethylmethacrylate. A borosilicate glass, a blue plate glass or the like is particularly preferable.

The color-converting/filter substrate of the present invention is manufactured by forming one type or a plurality of types of color-converting layers in a desired pattern on the supporting substrate 1 as described earlier. The color-converting layers are manufactured in the desired pattern by applying compositions each containing colorant(s) and a resist as described earlier onto the supporting substrate 1, exposing with light via a mask for forming the desired pattern, and patterning. The color-converting layers have a thickness of at least 5 μm, preferably 8 to 15 μm.

When manufacturing a multi-color display panel, it is preferable to form color-converting layers 2 to 4 of three types, red, green and blue. In the case of using a light emitter that emits blue or blue/green light, as described earlier it is also possible to form fluorescent red and green color-converting layers and non-fluorescent blue filter layers, or fluorescent red color-converting layers and non-fluorescent green and blue filter layers.

The desired pattern of the fluorescent color-converting layers and non-fluorescent filter layers depends on the usage. Taking rectangular or circular areas of red, green and blue as one set, this set may be formed repeatedly over the whole surface of the supporting substrate. Alternatively, taking parallel stripes (areas each having a desired width and having a length corresponding to the length of the supporting substrate 1) of red, green and blue as one set, this set may be formed repeatedly over the whole surface of the supporting substrate. Color-converting layers of a particular color can also be disposed more (in terms of number or area) than the color-converting layers of the other colors.

The color conversion type multi-color organic EL display panel of the present invention comprises a color-converting/filter substrate as described above, and an organic EL light emitter provided on the inorganic film layer 6 of the filter substrate. The organic EL light emitter may be formed on the color-converting/filter substrate, or may be formed separately and then put onto the color-converting/filter substrate. The color conversion type multi-color organic EL display panel is such that light in the near ultraviolet to visible region, preferably light in the blue to blue/green region, emitted from the organic EL light emitter enters the color-converting layers, and visible light of a different wavelength exits from the color-converting layers.

The organic EL light emitter has a structure in which an organic light-emitting layer is disposed between a set of electrodes, and if necessary a hole injection layer, an electron injection layer and so on may be interposed. Specifically, an organic EL light emitter having a layer structure such as the following is adopted.

(1) Anodes/organic light-emitting layer/cathodes
(2) Anodes/hole injection layer/organic light-emitting layer/cathodes
(3) Anodes/organic light-emitting layer/electron injection layer/cathodes
(4) Anodes/hole injection layer/organic light-emitting layer/electron injection layer/cathodes
(5) Anodes/hole injection layer/hole transport layer/organic light-emitting layer/electron injection layer/cathodes In the above layer structure, it is preferable for at least one of the anodes and the cathodes to be transparent in the wavelength region of the light emitted by the organic EL light emitter; the light is emitted through these transparent electrodes, and is thus made to be incident on the color-converting layers. In the technical field in question, it is known that it is easy to make the anodes transparent, and hence in the present invention it is preferable to make the anodes transparent.

Publicly-known materials are used as the materials of the above-mentioned layers. To obtain luminescence from blue to blue/green in color, for example a fluorescent whitening agent of benzothiazole type, benzimidazole type, benzoxazole type or the like, a metal chelated oxonium compound, a styrylbenzene type compound, an aromatic dimethylidene type compound, or the like is preferably used as the organic light-emitting layer 10.

Figure 3:
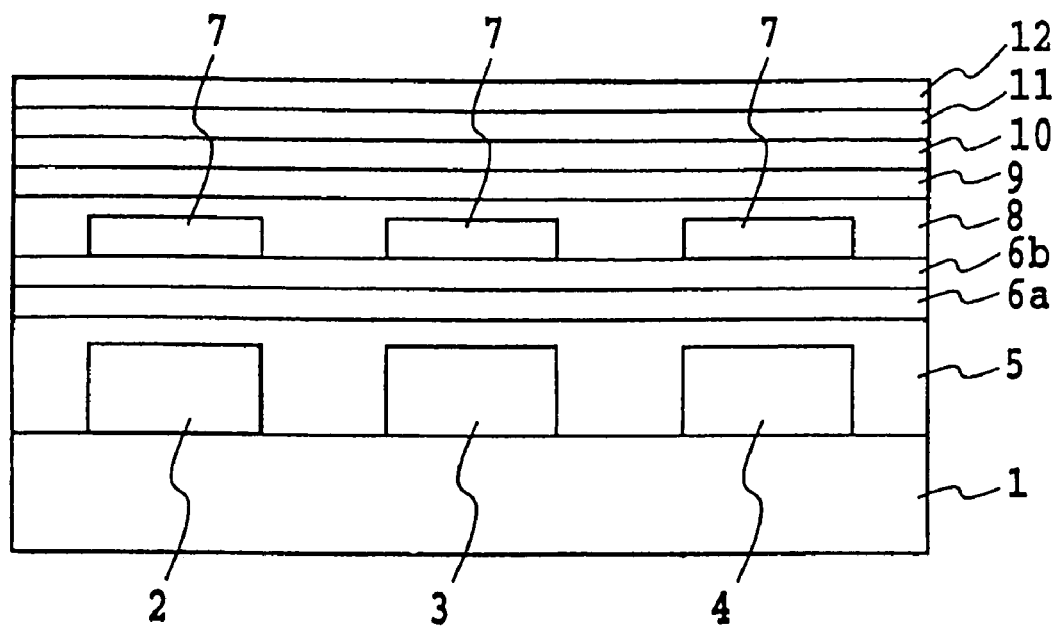
FIG. 3 is a schematic sectional view of a multi-color organic EL display panel of the present invention.

FIG. 3 shows an example of the multi-color organic EL display panel of the present invention. In FIG. 3, a part is shown that corresponds to one pixel of a multi-color organic EL display panel having a plurality of pixels for use as a color conversion type multi-color or full-color display panel. Transparent anodes (first electrode layers) 7 are formed in positions corresponding to the color-converting layers 2, 3 and 4 on the inorganic film layer 6 of the color-converting/filter substrate shown in FIG. 3, and a hole injection layer 8, a hole transport layer 9, an organic light-emitting layer 10, an electron injection layer 11, and cathodes (second electrode layers) 12 are formed in this order thereon.

The anodes 7 are transparent electrodes made of ITO or the like, and the cathodes 12 are metal electrodes. The anodes 7 and the cathodes 12 may each be formed in a pattern of parallel stripes, with the anodes 7 and the cathodes 12 intersecting one another. In this case, matrix driving can be carried out with the organic EL light emitter of the present invention, i.e. when voltages are applied to a particular stripe of the anodes 7 and a particular stripe of the cathodes 12, the part of the organic light-emitting layer 10 where these stripes intersect emits light. By applying voltages to selected stripes of the anodes 7 and the cathodes 12, it is thus possible to make only parts where particular fluorescent color-converting layers are positioned emit light.

Moreover, it is also possible to use a single anode 7 that is a uniform planar electrode having no striped pattern, and pattern the cathodes 12 so as to correspond to the individual pixels. In this case, switching devices are provided corresponding to the individual pixels, whereby it becomes possible to carry out so-called active matrix driving.

EXAMPLES

Following is a description of multi-color organic EL display panels that use the laminate type inorganic film layer according to the present invention, with reference to the drawings. Note that in the Examples and Comparative Examples, multi-color organic EL display panels having 60×80 pixels (each including R, G and B elements) with a pixel pitch of 0.33 mm were manufactured.

Example 1

A blue filter material (made by Fuji Hunt Electronics Technology; Color Mosaic CB-7001) was applied using a spin coating method onto a sheet of Corning glass (50×50× 1.0 mm). Patterning was then carried out using a photolithography method, thus obtaining blue filter layers 4 of thickness 10 m having a striped pattern with a line width of 0.1 mm and a pitch of 0.33 mm.

Formation of green color-converting layers 3 was accomplished by taking 0.7 parts by mass of Coumarin 6 as a fluorescent colorant and dissolving in 120 parts by mass of a propylene glycol monoethyl acetate (PGMEA) solvent. Next, 100 parts by mass of a photopolymerizable resin 'V259PA/P5' (trade name, Nippon Steel Chemical Co., Ltd.) was added to the solution and dissolved, thus obtaining a coating liquid. The coating liquid was applied using a spin coating method onto the Corning glass on which the striped pattern of the blue filter layers 4 had been formed, and then patterning was carried out using a photolithography method, thus obtaining green color-converting layers 3 of thickness 10 μm having a striped pattern with a line width of 0.1 mm and a pitch of 0.33 mm.

Formation of red color-converting layers 2 was accomplished by taking 0.6 parts by mass of Coumarin 6, 0.3 parts by mass of Rhodamine 6G and 0.3 parts by mass of Basic Violet 11 as fluorescent colorants and dissolving in 120 parts by mass of a propylene glycol monoethyl acetate (PGMEA) solvent. 100 parts by mass of a photopolymerizable resin 'V259PA/P5' (trade name, Nippon Steel Chemical Co., Ltd., refractive index 1.59) was added to the solution and dissolved. The resulting coating liquid was applied using a spin coating method onto the Corning glass on which the striped pattern of the blue filter layers 4 and the striped pattern of the green color-converting layers 3 had been formed, and then patterning was carried out using a photolithography method, thus obtaining red color-converting layers 2 of thickness 6 μm having a striped pattern with a line width of 0.1 mm and a pitch of 0.33 mm.

A UV-curable resin (epoxy-modified acrylate) was applied by a spin coating method onto the substrate on which the blue filter layers 4, the green color-converting layers 3 and the red color-converting layers 2 had been formed, and then exposure to a high-pressure mercury lamp was carried out, thus forming a polymeric film layer 5 of thickness 8 μm. When forming the polymeric film layer 5, there was no deformation of the patterns of the color-converting layers 2 to 4, and moreover the upper surface of the polymeric film layer 5 was flat.

Next, an Ag film of thickness 10 nm was formed by a DC sputtering method at room temperature as a metallic film. When doing this, Ag was used as the sputtering target, and Ar was used as the sputtering gas.

Next, an SiO$_x$ film of thickness 300 nm was formed by an RF sputtering method at room temperature as an insulating film. When doing this, Si was used as the sputtering target, and a mixed gas of Ar and oxygen was used as the sputtering gas.

Through the above steps, a color-converting/filter substrate having an inorganic film layer 6 comprising a laminate of a metallic film and an insulating film was obtained.

An organic EL light emitter having a 6-layer structure of anodes 7, a hole injection layer 8, a hole transport layer 9, an organic light-emitting layer 10, an electron injection layer 11 and cathodes 12 as shown in FIG. 3 was formed on the color-converting/filter substrate manufactured as described above.

Specifically, first, a transparent electrode layer (IDIXO (made by Idemitsu Kosan Co., Ltd., a mixture of an indium/zinc oxide and indium oxide)) was deposited by a sputtering method over the whole surface of the inorganic film layer 6 (insulating film 6b) constituting the uppermost layer of the color-converting/filter substrate. Next, a resist agent 'OFRP-800' (trade name, made by Tokyo Ohka Kogyo Co., Ltd.) was applied onto the IDIXO. Patterning was then carried out by a photolithography method, thus forming anodes 7 of thickness 100 nm having a striped pattern with a line width of 0.094 mm and gaps of 0.016 mm in the positions of each of the various colored light-emitting parts.

Figure 4:
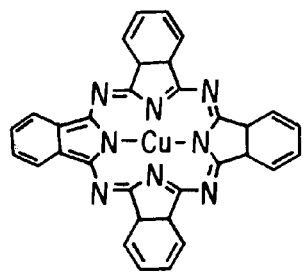
FIG. 4 is a table illustrating the structural formulae of the materials used in the various layers of a preferred substrate.
Figure 4:
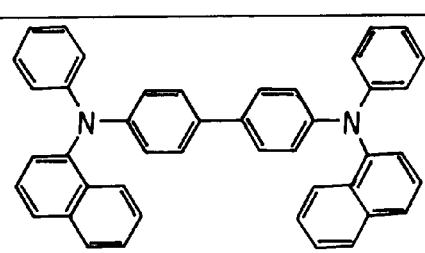
Figure 4:
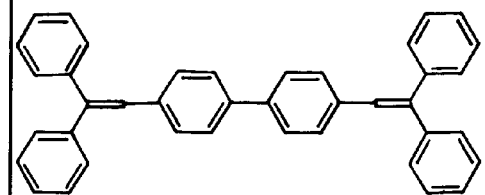
Figure 4:
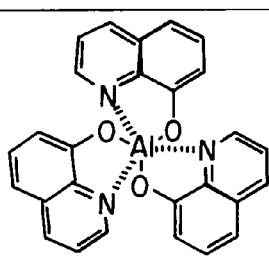

Next, the color-converting/filter substrate having the anodes 7 formed thereon was installed inside a resistive heating vapor deposition apparatus, and a hole injection layer 8, a hole transport layer 9, an organic light-emitting layer 10, and an electron injection layer 11 were deposited in this order over the whole surface without releasing the vacuum. During the deposition, the pressure inside the vacuum chamber was reduced down to $1 \times 10^{-4}$ Pa. Copper phthalocyanine (CuPc) was formed to a thickness of 100 nm as the hole injection layer 8. 4,4'-bis[N-(1-naphthyl)-N-phenylamino]biphenyl ($\alpha$-NPD) was formed to a thickness of 20 nm as the hole transport layer 9. 4,4'-bis (2,2'-diphenylvinyl)biphenyl (DPVBi) was formed to a thickness of 30 nm as the organic light-emitting layer 10. An aluminum chelate (tris(8-hydroxyquinoline) aluminum complex, Alq) was formed to a thickness of 20 nm as the electron injection layer 11. The structural formulae of the materials used in the various layers are shown in FIG. 4.

Next, without releasing the vacuum, using a mask giving a striped pattern of lines of width 0.30 mm and pitch 0.33 mm (gap width 0.03 mm) orthogonal to the striped pattern of the (ITO) anodes 7, cathodes 12 each comprising an Mg/Ag (mass ratio 10/1) layer of thickness 200 nm were formed.

The organic EL light emitter obtained in this way was sealed using sealing glass (not shown in the drawings) and a UV-curing adhesive under a dry nitrogen atmosphere (oxygen and moisture concentration both not more than 10 ppm) in a glove box, thus obtaining a multi-color organic EL display panel.

Example 2

A multi-color organic EL display panel was obtained as in Example 1, except that an Ag film of thickness 10 nm, an $SiO_x$ film of thickness 300 nm, an Ag film of thickness 10 nm, and an $SiO_x$ film of thickness 300 nm were formed in this order as the inorganic film layer. Note that the formation of the second Ag film was carried out under the same conditions as for the first Ag film, and the formation of the second $SiO_x$ film was carried out under the same conditions as for the first $SiO_x$ film.

Example 3

A multi-color organic EL display panel was obtained as in Example 1, except that an IZO film of thickness 200 nm and an $SiO_x$ film of thickness 300 nm were formed in this order as the inorganic film layer. The deposition of the IZO film was carried out by a sputtering method using IDIXO as the sputtering target and a mixed gas of Ar and oxygen as the sputtering gas.

Comparative Example 1

A multi-color organic EL display panel was obtained as in Example 1, except that only an $SiO_x$ film of thickness 300 nm was formed as the inorganic film layer.

Comparative Example 2

A multi-color organic EL display panel was obtained as in Example 1, except that an inorganic film layer was not formed.

Evaluation

Three multi-color organic EL display panels were manufactured for each of the Examples and Comparative Examples, and driving tests were carried out. Line-sequential scanning was utilized with a driving frequency of 60 Hz and a duty cycle 1/60, with the current per pixel being 100 µA Continuous driving was carried out for 1000 hours, and then the proportion of the non-light-emitting area in the display panel and the brightness were measured, and a comparison was made with the initial non-light-emitting area and brightness. The results are shown in table illustrated in FIG. 5.

In the table shown in FIG. 5, the percentage increase in the non-light-emitting area is the percentage by which the non-light-emitting area had increased after the continuous driving compared with the initial non-light-emitting area. Moreover, the percentage retention of the brightness is the percentage ratio of the brightness after the continuous driving to the initial brightness. Furthermore, the ratio for the non-light-emitting area is the percentage increase in the non-light-emitting area for the Example or Comparative Example in question divided by that for Comparative Example 1, and the ratio for the brightness is the percentage retention of the brightness for the Example or Comparative Example in question divided by that for Comparative Example 1.

As can be seen from FIG. 5, in the case that an inorganic film layer is not used, after 1000 hours of continuous driving, most of the multi-color organic EL display panel has stopped emitting light, whereas by using an inorganic film layer, the majority of the area of the display can be kept able to emit light. Furthermore, in the case of using an inorganic film layer according to the present invention which is a laminate of metallic film(s) or metal oxide film(s) and insulating film(s), the increase in the non-light-emitting area and the drop in the brightness can be suppressed yet better.

As described above, by using the inorganic film layer of the present invention, migration of moisture from the color-converting layers to the organic EL light emitter, which may cause deterioration in the characteristics of the organic EL light emitter, can be suppressed, and moreover heat generated during driving of the organic EL light emitter can be dispersed efficiently to the surroundings; it thus becomes possible to provide a multi-color organic EL display panel for which stable light emission characteristics are maintained over a prolonged period.

What is claimed is:

1. A method of manufacturing a multi-color organic EL display panel, comprising:
   forming, on a transparent supporting substrate, color-converting/filter layers of a single type or a plurality of types that each comprise a photopolymerizable resin film of thickness at least 5 μm containing at least one fluorescent colorant and have a desired pattern;
   forming a flat, transparent polymeric film layer covering said color-converting/filter layers;
   forming, using a sputtering method, a metallic film, or a metal oxide film containing at least one of In, Sn and Zn;
   forming an insulating film containing at least one of Si and Al and at least one of O and N;
   forming a first electrode layer;
   forming an organic light-emitting layer; and
   forming a second electrode layer.

2. A multi-color organic EL display panel, comprising:
   a transparent supporting substrate,
   color-converting/filter layers on said substrate that are of a single type or a plurality of types and that each comprise a photopolymerizable resin film of thickness at least 5 μm containing at least one fluorescent colorant and have a desired pattern;
   a flat, transparent polymeric film layer covering said color-converting/filter layers;
   a laminate of layers covering said polymeric film layer, said laminate comprising at least one metallic film or metal oxide film layer containing at least one of In, Sn and Zn and at least one insulating film containing at least one of Si and Al and at least one of O and N;
   a first electrode layer overlying said laminate of layers;
   an organic light-emitting layer overlying said first electrode layer; and
   a second electrode layer overlying said organic light-emitting layer.

3. A multi-color organic EL display panel according to claim 2, wherein said first electrode layer is patterned.

4. A multi-color organic EL display panel according to claim 2, comprising a single first electrode layer and a patterned second electrode layer.

5. A multi-color organic EL display panel according to claim 2, wherein said second electrode is patterned.

6. A multi-color organic EL display panel according to claim 2, comprising a patterned first electrode layer and a single second electrode layer.

7. A multi-color organic EL display panel according to claim 2, wherein said first and second electrode layer are patterned.

8. A multi-color organic EL display panel according to claim 2, wherein said first electrode layer is patterned to correspond to the pattern of the color-converting layer.

9. A color-converting/filter substrate, comprising:
   a transparent supporting substrate;
   color-converting/filter layers of a single type or a plurality of types that are arranged on said supporting substrate and that each comprise a photopolymerizable resin film of thickness at least 5 μm containing at least one fluorescent colorant formed in a desired pattern;
   a polymeric film layer that covers said color-converting/filter layers and is formed so as to be transparent and flat; and
   a transparent inorganic film layer that is formed on said polymeric film layer;
   wherein said inorganic film layer is a laminate of a plurality of electrically conductive metallic films and a plurality of insulating films, each of said plurality of insulating films containing at least one of Si and Al and at least one of O and N.

10. A color-converting/filter substrate, comprising:
    a transparent supporting substrate;
    color-converting/filter layers of a single type or a plurality of types that are arranged on said supporting substrate and that each comprise a photopolymerizable resin film of thickness at least 5 μm containing at least one fluorescent colorant formed in a desired pattern;
    a polymeric film layer that covers said color-converting/filter layers and is formed so as to be transparent and flat; and
    a transparent inorganic film layer that is formed on said polymeric film layer;
    wherein said inorganic film layer is a laminate of a plurality of electrically conductive metal oxide films each containing at least one of In, Sn and Zn, and a plurality of insulating films each containing at least one of Si and Al and at least one of O and N.

11. The color-converting/filter substrate according to claim 2 wherein said metallic film(s) each comprise a metal selected from the group consisting Ag, AL, Au, Cr, Cu, In, Mo, Ni, Pt, Rh, Ru, W, Zn, and alloys thereof.

12. A multi-color organic EL display panel according to claim 2, wherein said metallic film(s) each comprise a metal selected from the group consisting of Ag, Al, Au, Cr, Cu, In, Mo, Ni, Pt, Rh, Ru, W, Zn, and alloys thereof.

13. A multi-color organic EL display panel according to claim 2, wherein said inorganic film layer is a laminate of a plurality of electrically conductive metal oxide film(s) each containing at least one of In, Sn and Zn, and one or a plurality of insulating film(s) each containing at least one of Si and Al and at least one of O and N.

14. A method of manufacturing a multi-color organic EL display panel, comprising:
    forming, on a transparent supporting substrate, color-converting/filter layers of a single type or a plurality of types that each comprise a photopolymerizable resin film of thickness at least 5 μm containing at least one fluorescent colorant and have a desired pattern;
    forming a flat, transparent polymeric film layer covering said color-converting/filter layers;
    forming a laminate comprising a plurality of sputtered metallic or metal oxide films containing at least one of In, Sn and Zn alternately laminated with a plurality of insulating films containing at least one of Si and Al and at least one of O and N
    forming a first electrode layer;
    forming an organic light-emitting layer; and
    forming a second electrode layer.

* * * * *